(12) United States Patent
Huang

(10) Patent No.: US 7,417,510 B2
(45) Date of Patent: Aug. 26, 2008

(54) DIRECT DIGITAL INTERPOLATIVE SYNTHESIS

(75) Inventor: Yunteng Huang, Irvine, CA (US)

(73) Assignee: Silicon Laboratories Inc., Austin, TX (US)

( * ) Notice: Subject to any disclaimer, the term of this patent is extended or adjusted under 35 U.S.C. 154(b) by 69 days.

(21) Appl. No.: 11/550,223

(22) Filed: Oct. 17, 2006

(65) Prior Publication Data

US 2008/0079502 A1 Apr. 3, 2008

Related U.S. Application Data

(60) Provisional application No. 60/827,325, filed on Sep. 28, 2006.

(51) Int. Cl.
*H03B 19/00* (2006.01)
*H03L 1/02* (2006.01)
*H03L 7/18* (2006.01)

(52) U.S. Cl. .................. 331/74; 331/1 A; 331/16; 331/44; 331/176; 327/117; 327/156

(58) Field of Classification Search ............ 331/1 A, 331/16, 44, 66, 74, 176; 327/115, 117, 118, 327/156–159
See application file for complete search history.

(56) References Cited

U.S. PATENT DOCUMENTS 7,181,180 B1 * 2/2007 Teo et al. .................... 455/260

OTHER PUBLICATIONS

Allen, Daniel J. and Carley, Adam L., "Free-Running Ring Frequency Synthesizer," 2006 IEEE International Solid-State Circuits Conference, Feb. 7, 2006, pp. 380-381.

Dai, Fa Foster et al., "A Direct Digital Frequency Synthesizer with Fourth-Order Phase Domain ΔΣ Noise Shaper and 12-bit Current-Steering DAC," IEEE Journal of Solid-State Circuits, vol. 41, No. 4, Apr. 2006, pp. 839-850.

Meninger, Scott E. and Perrott, Michael H., "A 1-MHZ Bandwidth 3.6GHz 0.18-μm CMOS Fractional-N Synthesizer Utilizing a Hybrid PFD/DAC Structure for Reduced Broadband Phase Noise," IEEE Journal of Solid-State Circuits, vol. 41, No. 4, Apr. 2006, pp. 966-980.

Yang, Chin-Yuan et al., "A High-Frequency Phase-Compensation Fractional-N Frequency Synthesizer," IEEE International Symposium on Circuits and Systems, 2005 ISCAS, May 23-26, 2005, pp. 5091-5094.

* cited by examiner

*Primary Examiner*—David Mis
(74) *Attorney, Agent, or Firm*—Zagorin O'Brien Graham LLP

(57) ABSTRACT

A clock synthesis circuit includes a delta sigma modulator that receives a divide ratio and generates an integer portion and a digital quantization error (a fractional portion). A fractional-N divider divides a received signal according to a divide control value corresponding to the integer portion and generates a divided signal. A phase interpolator adjusts a phase of the divided signal according to the digital quantization error to thereby reduce noise associated with the fractional-N divider.

23 Claims, 12 Drawing Sheets

DIRECT DIGITAL INTERPOLATIVE SYNTHESIS

CROSS-REFERENCE TO RELATED APPLICATION(S)

This application claims benefit under 35 U.S.C. § 119(e) of U.S. Provisional Patent Application No. 60/827,325, entitled "DIRECT DIGITAL INTERPOLATIVE SYNTHESIS," filed Sep. 28, 2006, naming Yunteng Huang as inventor, which application is hereby incorporated by reference.

BACKGROUND

1. Field of the Invention

This invention relates to generating clock signals for electronic devices.

2. Description of the Related Art

Clock synthesizers generate clock signals utilized by a wide variety of electronic products. A typical synthesizer utilizes a phase-locked loop (PLL) supplied with a reference signal from a source such as a crystal oscillator. The output frequency of the signal supplied by the synthesizer can be determined by a divider value of the feedback divider in the PLL. Thus, a reference frequency supplied to the PLL is "multiplied" based on the divider value to generate the synthesized clock frequency.

Several types of divider circuits have been utilized in PLLs. One kind of divider is the integer-N divider in which the input signal is divided by an integer number. For example, FIG. 1A illustrates the timing diagram of several integer divides including a divide by two, a divide by three and a divide by four. The signal being divided is CLKin. Note that no jitter is introduced in the frequency division process, other than noise from circuit non-idealities. FIG. 1B illustrates the simple integer divide by 2 provided by a D flip-flop (DFF) 101.

Another type of PLL architecture uses a fractional-N divider. FIGS. 2 and 3 illustrate fractional-N frequency division. Fractional-N frequency division changes the integer divide value to match the desired ratio. Thus, a stream of integers is supplied that approximate the desired ratio. For example, FIG. 2 illustrates a timing diagram of a divide by 2.25. The input clock (CLKin) is shown as waveform 201 having a period of one unit interval (UI). The output of the fractional-N divider is shown in waveform 203. As shown in waveform 203, the divide by 2.25 is achieved by a sequence of divide by 2 for three periods and a divide by 3 for one period, assuming a first order delta sigma modulator is used to control the fractional-N divider. Waveform 205 illustrates the ideal waveform for a divide by 2.25. The quantization noise of the modulator, at the output of the fractional-N divider is shown as the difference at 207, 209, and 211, between the actual output of the fractional-N divider shown in waveform 203 and the ideal output for a divide by 2.25 shown in waveform 205.

FIG. 3 illustrates a PLL 300 with a fractional-N feedback divider 303. Delta-sigma modulator 301 supplies a divide sequence to the fractional-N feedback divider 303. The fractional-N divider 303 receives a divide value sequence corresponding to a desired divider value. The fractional-N divider 303 supplies the divided signal to phase detector 305 with noise associated with the nature of the fractional-N divider. In fractional-N synthesis, the fractional-N noise may be filtered out by the PLL loop. In addition, phase error correction may be utilized to address the jitter introduced by the divider by introducing an offset into the PLL corresponding to the jitter generated by the fractional-N divider.

However, the clock synthesizers described above may have limited frequency coverage (integer dividers) and/or require a complex loop filter and complex VCO control that increase the cost in design effort and chip area, resulting in more expensive products that may be too expensive in cost or real estate for significant portions of the clock synthesizer market.

Thus, it would be desirable to provide a low-cost, flexible, clock synthesizer solution.

SUMMARY

Accordingly, in one embodiment an apparatus is provided that includes a fractional-N divider configured to receive a signal and to supply a divided signal according to a divide control signal supplied by a delta sigma modulator. The delta sigma modulator is configured to receive a divide ratio and generate an integer portion and a digital quantization error. A divide control signal corresponding to the integer portion is supplied to the fractional-N divider to control the divide. A phase interpolator is coupled to the fractional-N divider and to the delta sigma modulator to adjust a phase of the divided signal according to the digital quantization error supplied by the delta sigma modulator, to thereby reduce noise associated with the fractional-N divider.

In another embodiment a method is provided that includes receiving a divide value in a delta sigma modulator and supplying as a control value to a fractional-N divider, an integer value generated by the delta sigma modulator. The fractional-N divider divides a signal according to the control value corresponding to the integer portion and generates a divided signal. A phase interpolator adjusts the divided signal according to a digital quantization error of the delta sigma modulator to thereby reduce noise associated with the fractional-N divider.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 4:
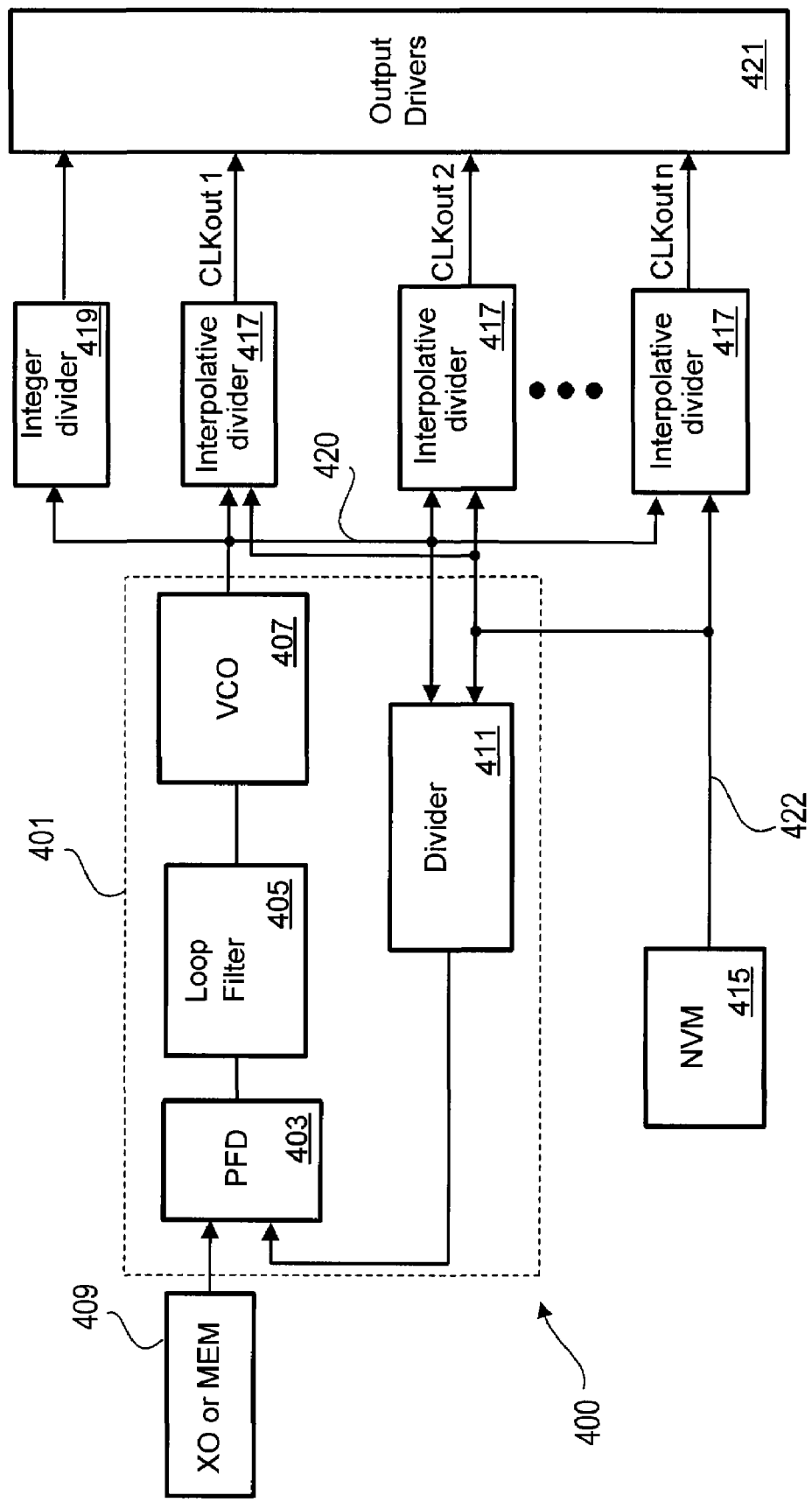
FIG. 4 illustrates an embodiment of an interpolative clock synthesizer incorporating multiple interpolative dividers to generate multiple independent outputs.

Referring to FIG. 4 an exemplary architecture of an interpolative clock synthesizer 400 is illustrated. The architecture includes a PLL 401 that includes a phase/frequency detector (PFD) 403, a loop filter 405, and a voltage controlled oscillator (VCO) 407. The loop filter may be implemented as a digital loop filter to avoid the necessity of off-chip capacitors. The VCO may be implemented as a ring oscillator or as an LC oscillator. Other oscillator structures may also be utilized. The PFD 403 receives a reference clock signal, which can come from a fixed source 409 such as a crystal oscillator or micro electro mechanical structure (MEMS) oscillator.

The PLL 401 also includes a divider 411. A non-volatile memory 415 supplies a divide ratio to the divider 411. In addition, the one or more interpolative dividers 417 are provided that receive the VCO 407 output signal 420. Note that divider 411 may also be implemented as an interpolative divider. For flexibility, an integer divider 419 may also be provided. The dividers 417 and 419 supply the output drivers 421. The interpolative dividers 417 receive divide ratios 422 from the NVM 415.

Figure 5:
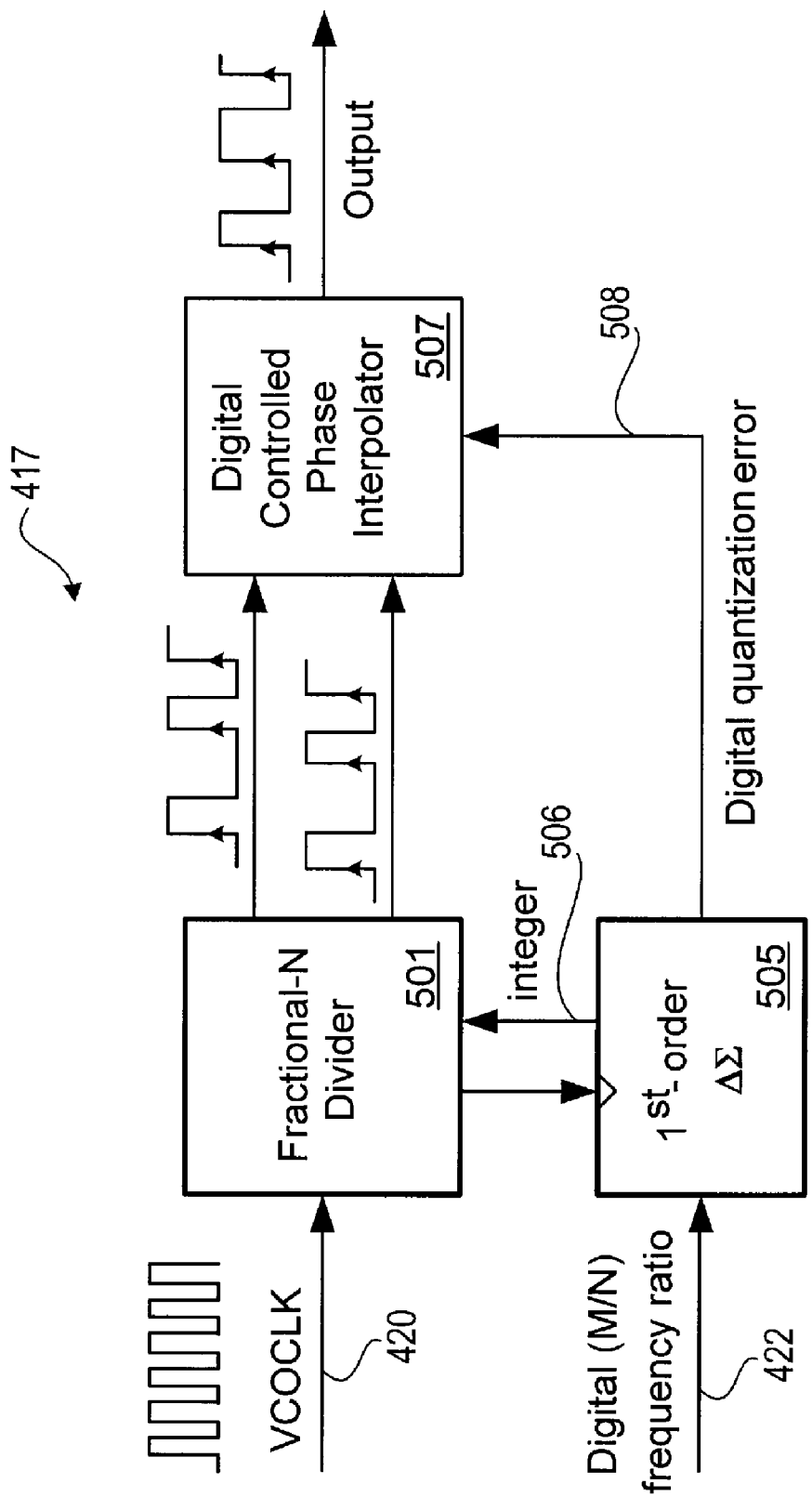
FIG. 5 illustrates an embodiment of an interpolative divider.

Referring to FIG. 5, an exemplary interpolative divider 417 is illustrated. The divider includes a fractional-N divider 501, which receives the VCO clock 420. A first order delta sigma modulator receives the digital divide ratio (M/N) stored by the non-volatile memory or other memory location. For example, a programming interface on the integrated circuit may provide the divide ratio to a programmable register. The integer portion of the digital divide ratio is supplied to the fractional-N divider 501 as divide control signal 506 in a stream of integers to approximate the actual divide ratio. The digital quantization error, corresponding to the fractional portion of the divide ratio, is supplied to the digitally controlled phase interpolator 507. The jitter introduced by the fractional-N divider 501 is canceled by interpolation in phase interpolator 507 based on the digital quantization error supplied by the delta sigma modulator 505. Thus, the VCOCLK is divided down by the fractional-N divider according to the control information provided by the delta sigma modulator 505. The phase interpolator 507 is used to cancel the quantization errors in the output of the fractional-N divider 501.

Figure 6:
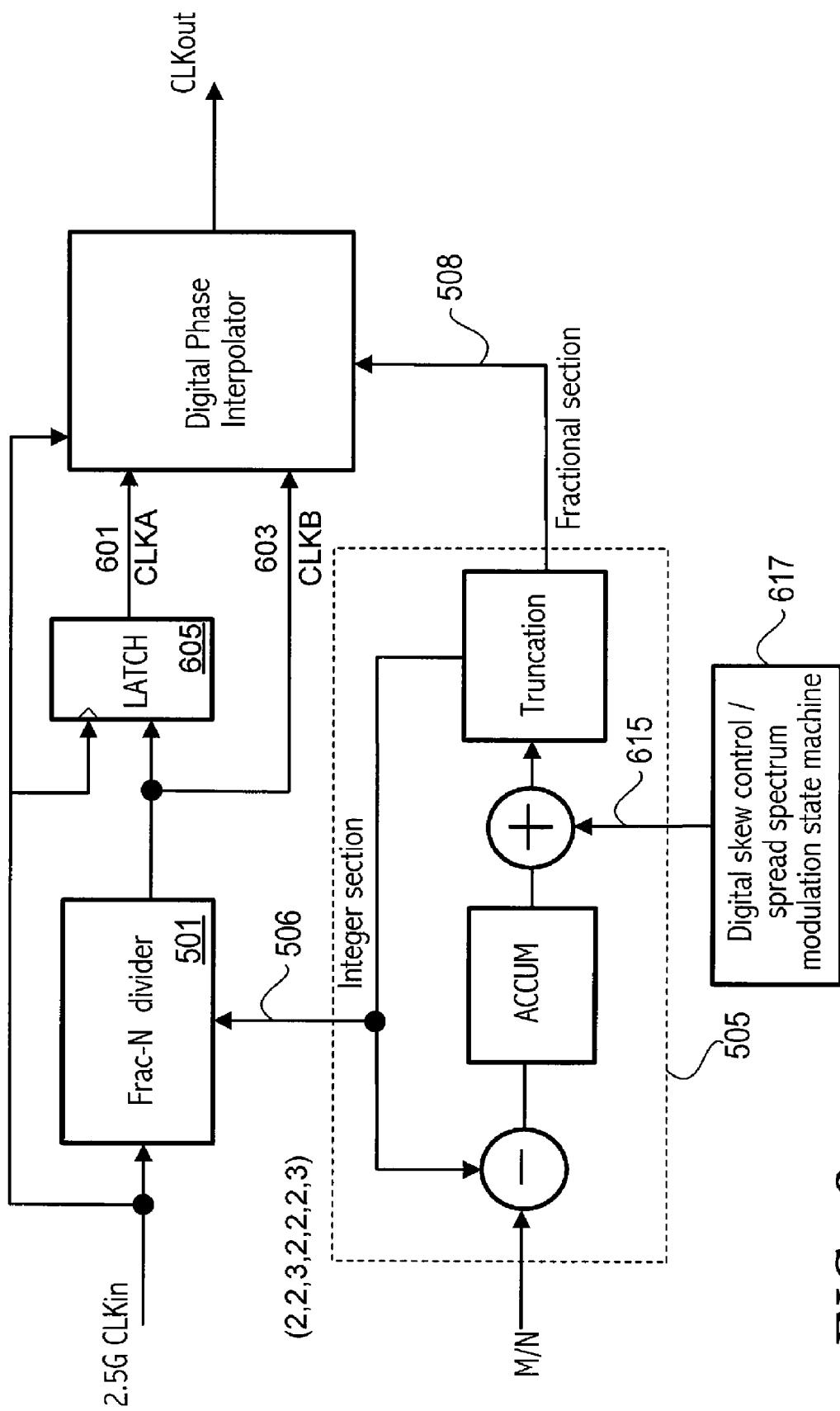
FIG. 6 illustrates additional details of an embodiment of an interpolative divider.

FIG. 6 shows additional details of the delta sigma modulator 505. In addition, an embodiment is shown in which the digital phase interpolator receives two signals 601 (CLKA) and 603 (CLKB) to interpolate. The signal 603 is supplied from the fractional-N divider 501. Latch 605 also receives the output 603 from the fractional-N divider and supplies the signal 601 to the digital phase interpolator. The latch delays the output of the divider by one half clock period of the VCO allowing the interpolator to interpolate between those two signals.

Figure 7:
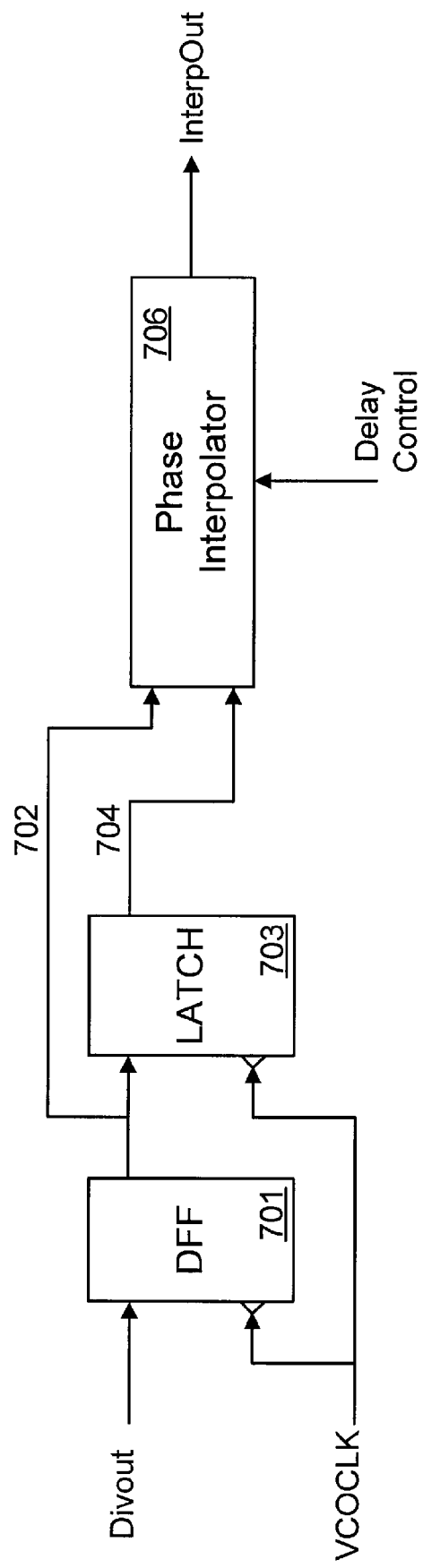
FIG. 7 illustrates additional details of an embodiment of an interpolative divider.

FIG. 7 illustrates an embodiment in which the signals supplied to the phase interpolator 706 come from a D flip-flop 701 and latch 703. Flip-flop 701 is coupled to the output of the divider. The two signals 702 and 704, supplied to the phase interpolator 706, are separated by one half period of the VCO clock.

Figure 8:
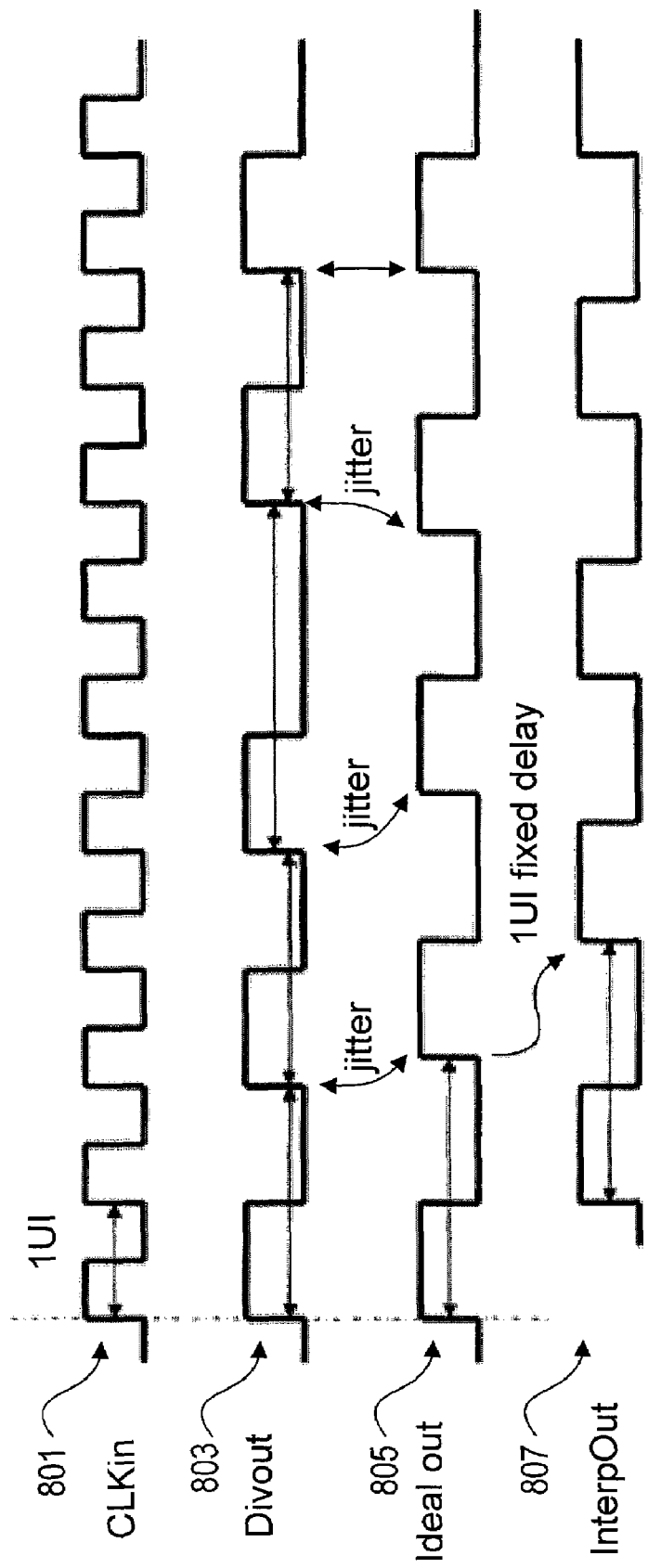
FIG. 8 illustrates a timing chart of an exemplary interpolative divide operation.

FIG. 8 illustrates operation of the interpolator for a divide by 2.25. The VCO supplies the CLKin shown in waveform 801. The fractional-N divider receives a stream of divide values of 2, 2, 2, 3, 2, 2, 2, 3, ..., which results in a divider output (Divout) shown as waveform 803. The ideal waveform is shown as ideal out 805. By interpolating between the signals 601 and 603 (or 702 and 704) based on the quantization error 508 supplied by the sigma delta modulator, an interpolator output signal is shown with the jitter removed.

Figure 1A:
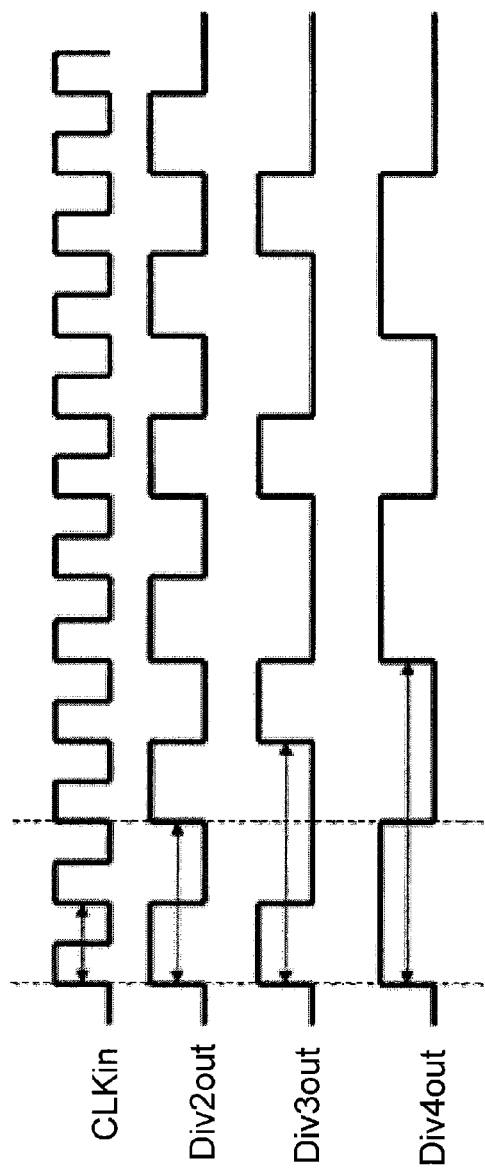
FIG. 1A illustrates integer frequency division.
Figure 1B:
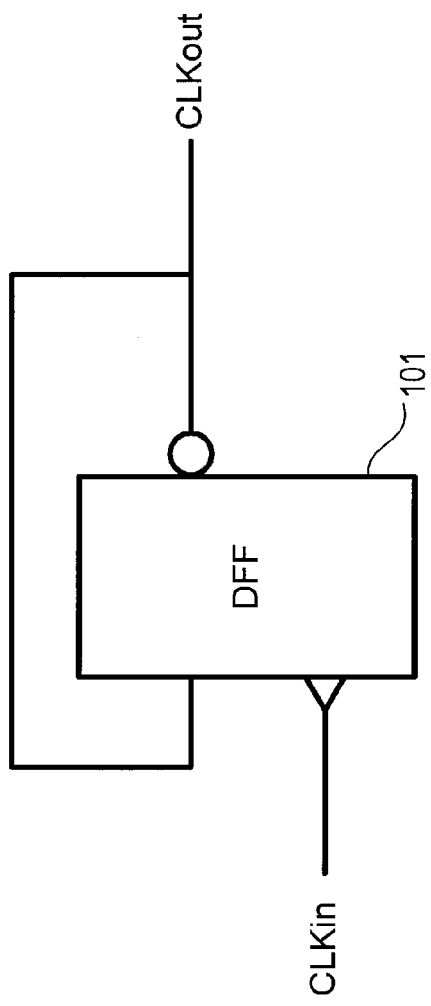
FIG. 1B illustrates a circuit providing a simple divide circuit to provide a divide by two division.
Figure 2:
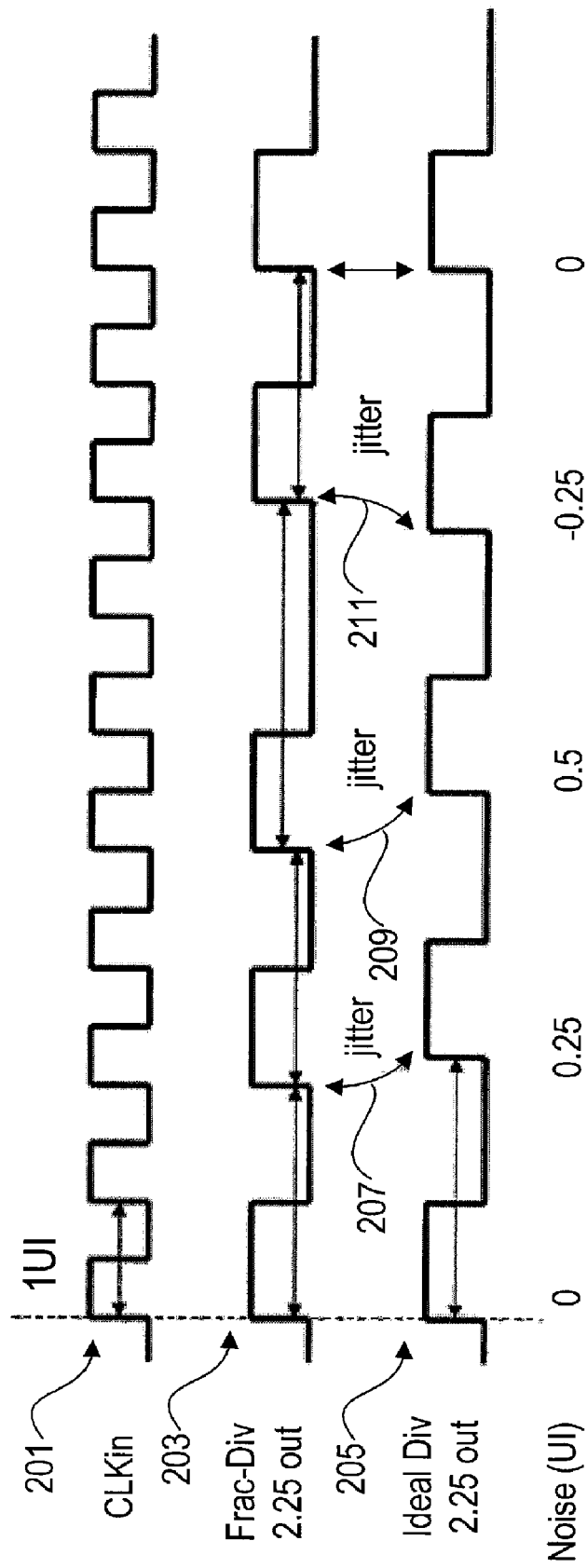
FIG. 2 illustrates a timing chart of an exemplary fractional-N frequency division operation.
Figure 3:
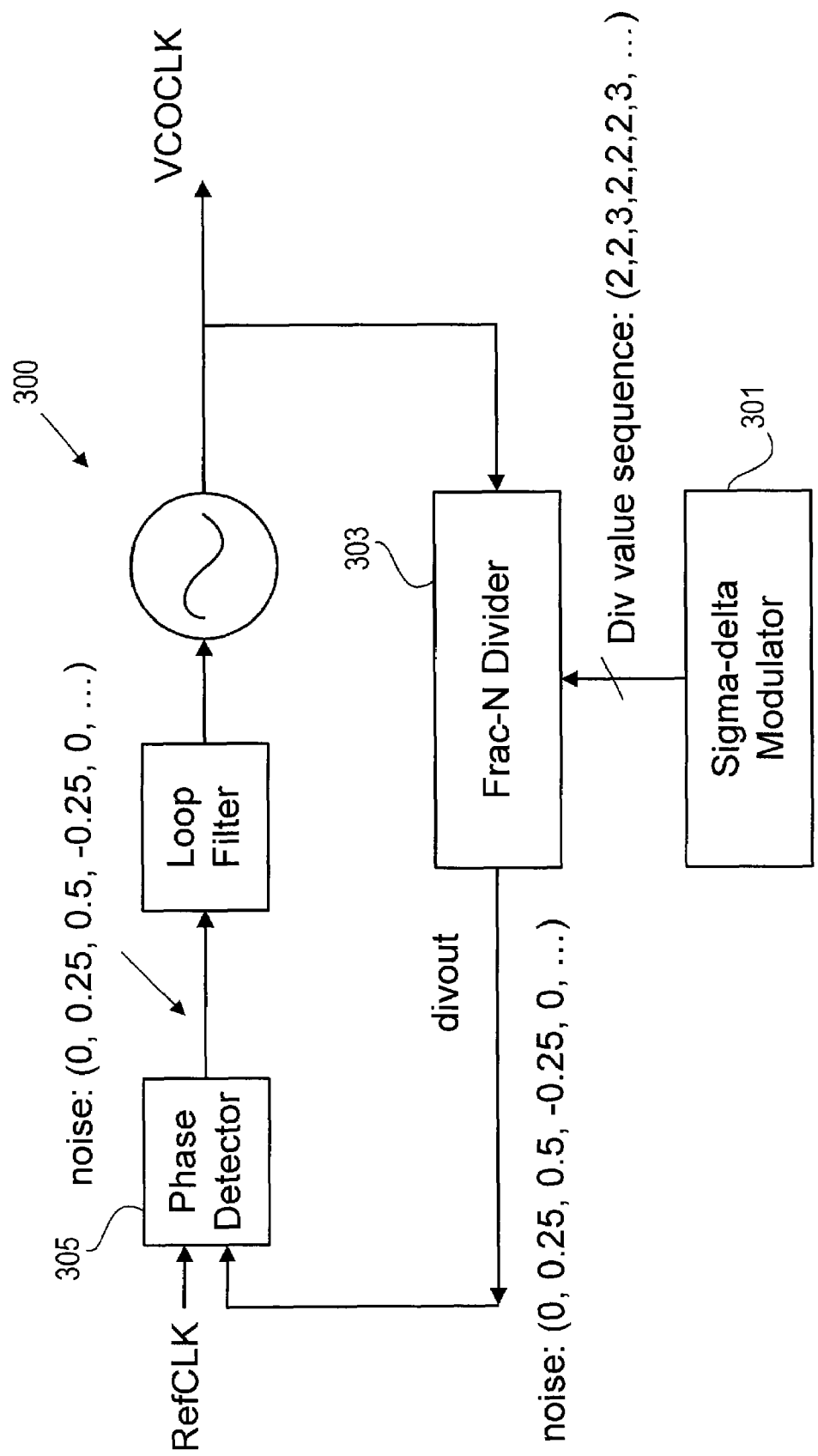
FIG. 3 illustrates a PLL with a fractional-N feedback divider.
Figure 9:
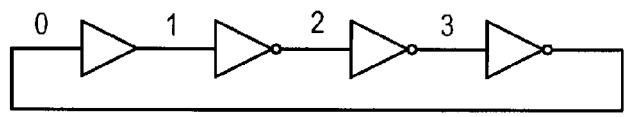
FIG. 9 illustrates a ring oscillator providing four clock phases that may be used by a phase interpolator in an interpolative divide.
Figure 10:
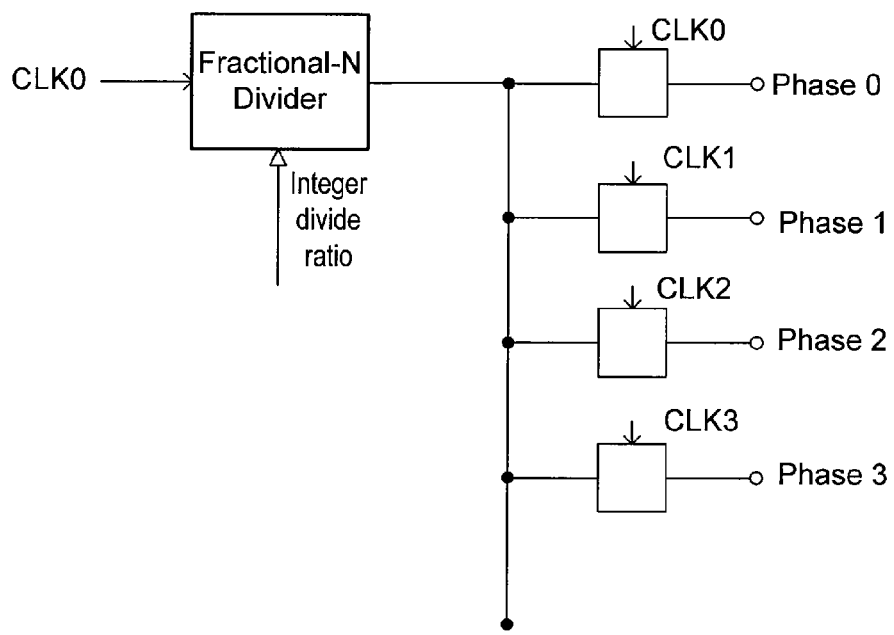
FIG. 10 illustrates utilization of the four clock phases to generate signals that may be used by a phase interpolator.
Figure 11:
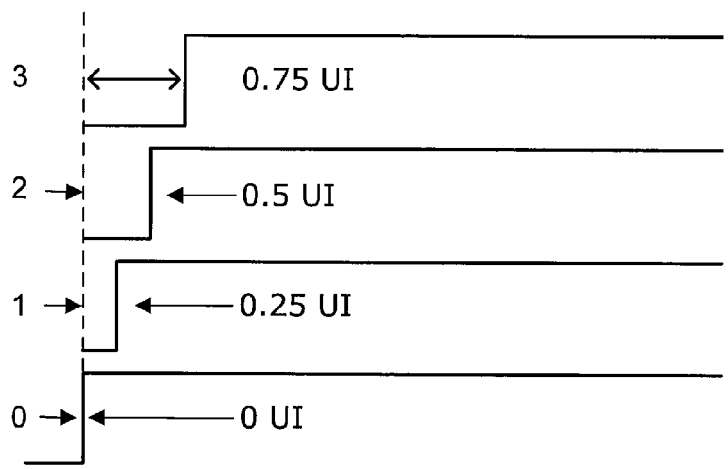
FIG. 11 illustrates the four clock phases generated by the circuit in FIG. 10, which can be used by the phase interpolator.

In an embodiment, rather than interpolation based on just two signals (e.g., 601 and 603) being supplied to the interpolator, the VCO circuit shown in FIG. 9 generates four equally spaced phases of the VCO clock. CLK0 is supplied as the VCO clock to the fractional-N divider. The four phases are used in FIG. 10 to generate the waveforms shown in FIG. 1. The interpolator can then use appropriate ones of the four phases in generating the properly interpolated waveform in accordance with the digital quantization error. Using multiple clock phases of a ring oscillator to feed the digital phase interpolator can improve its linearity, hence reduce output jitter. Phase interpolator linearity will ultimately be limited by delay mismatches of the ring oscillator stages. A delay line could also be used to generate the multiple phases of the VCO clock to be used to generate multiple phases of the divider output for phase interpolation.

Note that multiple clock phases of a ring oscillator can also be used to supply the fractional-N divider to reduce quantization noise. However, the reduced quantization noise increases switch complexity to determine which clock phase to utilize to minimize the quantization error.

Figure 12A:
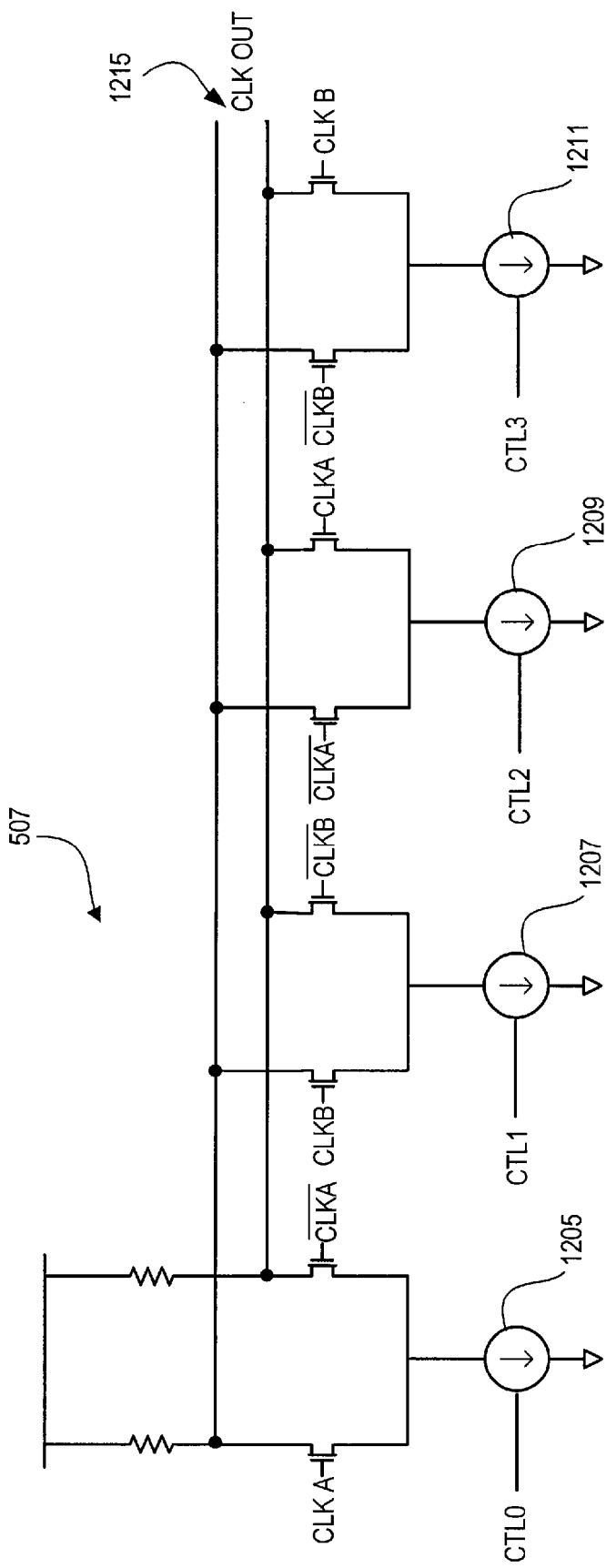
FIG. 12A illustrates an embodiment of a phase interpolator that may be used by an interpolative divider.
Figure 12B:
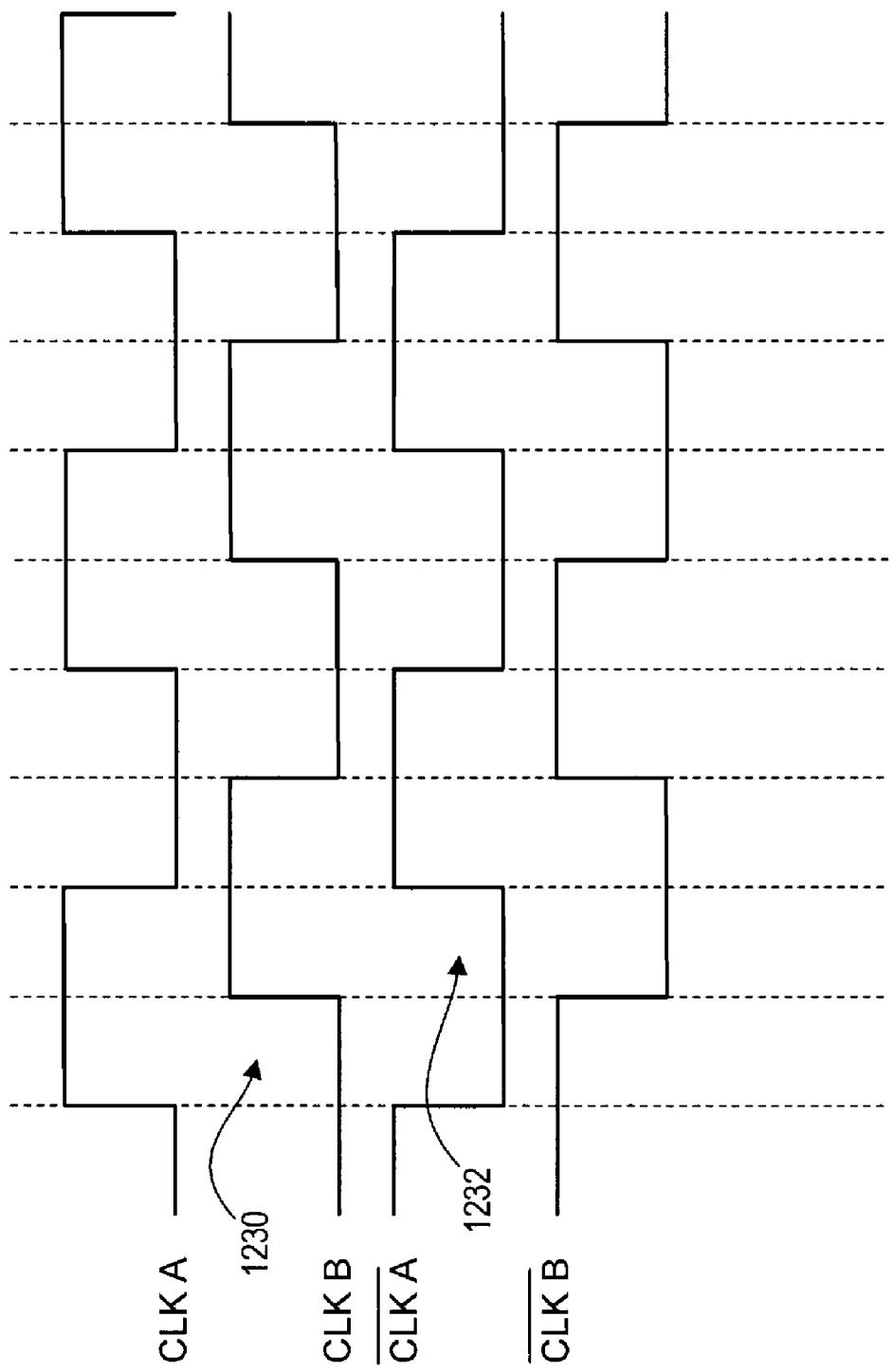
FIG. 12B shows a timing diagram of the phases supplied to the phase interpolator.

In an embodiment the interpolator provides a linear relationship between the digital control based on the digital quantization error and the phase adjustment to the output signal of the fractional-N divider. An exemplary interpolator 507 is shown in FIG. 12A. CLKA, $\overline{CLKA}$, CLKB, and $\overline{CLKB}$ are supplied to the interpolator 507. FIG. 12B illustrates exemplary waveforms for CLKA, $\overline{CLKA}$, CLKB, and $\overline{CLKB}$. CLKA and CLKB correspond to CLKA and CLKB shown as 601 and 603 in FIG. 6, and $\overline{CLKA}$, and $\overline{CLKB}$ are their complement. Note that while FIG. 6 is shown as a single-ended circuit for ease of understanding, a differential circuit may be preferred. In the embodiment in FIG. 12A, four current sources 1205, 1207, 1209, and 1211 are coupled to determine the interpolated differential output clock signal CLK-OUT supplied on nodes 1215. The digital quantization error is used to control the operation of the current sources 1205, 1207, 1209, and 1211. Assume, for example, the digital quantization error of the delta sigma modulator is 8 bits. Two bits may be used to select which of the current sources shown in FIG. 12 are enabled. With two bits, up to four different pairs of current sources can be selected. For example, referring to FIG. 12A and FIG. 12B, if the quantization error indicates that the properly interpolated waveform should be in region 1230, then the interpolator utilizes CLKA and CLKB and selects current sources 1205 and 1207 to be used for the interpolation. Similarly, if the quantization error indicates the properly interpolated waveform should be in region 1232, then the interpolator can utilize current sources 1207 and 1209 to interpolate between CLKB and $\overline{CLKA}$. Similarly, other appropriate pairs of current sources can be used by the interpolator based on the quantization error. Many other interpolator implementations may be used based on such factors as the accuracy required, power considerations, design complexity, chip area available, and the number of bits used to represent the digital quantization error.

Assuming 2 bits of the eight bit quantization error are used to select the current source pairs, 6 bits may be used to generate appropriate control values for CTL0, CTL1, CTL2, and CTL3 to provide appropriate digital to analog conversion (DAC) control, i.e., the strength of the current, for the various current sources based on the digital quantization error. Such techniques are well known in the art.

Note that the waveform shown in FIG. 8 is less than a 50% duty cycle. A 50% duty cycle can be achieved by utilizing a divide by two following the interpolation block or a phase interpolator that corrects for both rising and falling edges.

Referring back to FIG. 6, in an embodiment a spread spectrum clock modulation can be provided by supplying digital skew control 615 through the summing block 617. The digital skew supplied by digital skew control/spread spectrum modulation state machine 617 ensures that the frequencies generated by the clock synthesizer are spread around a center frequency, which can help, e.g., ensure compliance with requirements relating to RF emissions.

Figure 13:
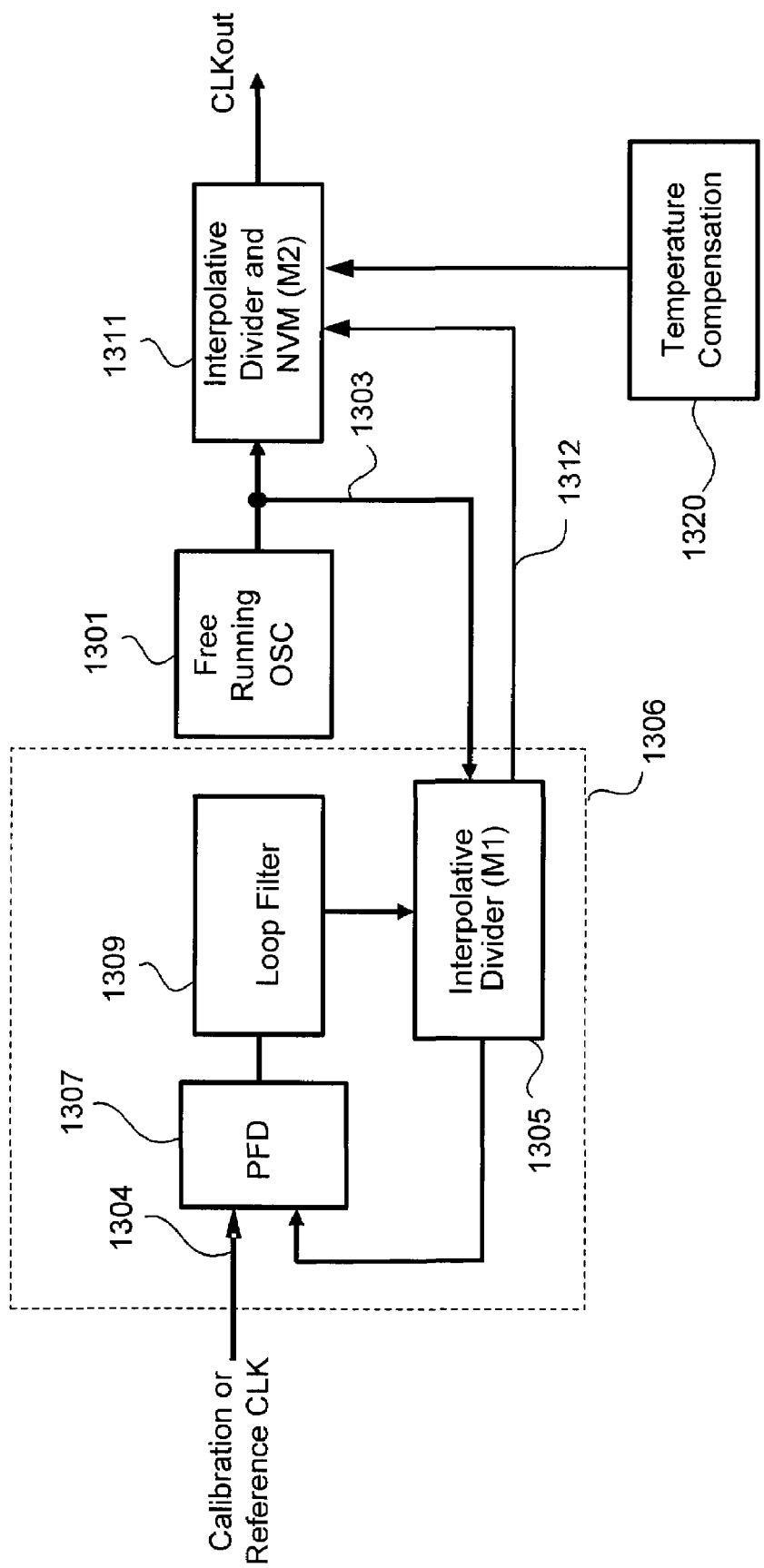
FIG. 13 illustrates an embodiment of a clock synthesizer that utilizes a free running oscillator and an interpolative divider.

Referring to FIG. 13, an embodiment is illustrated which utilizes a free running oscillator 1301. The use of the interpolative divider following the free running oscillator allows use of an oscillator with a very narrow or no tuning range such as a LC oscillator with a fixed capacitor or a MEMS based oscillator. Further, the use of the free-running oscillator eliminates the need for varactor control of the LC or ring oscillator or other oscillator structure. Eliminating the varactor and using a fixed capacitor for an LC oscillator circuit reduces noise associated with the varactor.

The free running oscillator 1301 supplies the oscillator output signal 1303 to the interpolative divider 1305. In an embodiment a calibration clock is supplied on 1304 to the phase and frequency detector (PFD) 1307. The PFD 1307 supplies the loop filter with the detected difference between the feedback signal from interpolative divider 1305 and the calibration clock on 1304. The loop filter 1309 supplies the filtered phase difference to the interpolative divider 1305. That filtered phase difference is used to adjust the divide ratio M1 of the interpolative divider 1305 and the divide ratio M2. During calibration, the frequency measuring loop 1306 measures the frequency relationship between the output of the free-running VCO 1301 and the calibration clock.

The free running oscillator 1301 also supplies the interpolative divider 1311, which is divided by the divide ratio M2. M2 is determined, e.g., by the desired output frequency and the value of M1. For example, if the desired output frequency is 75 MHz, and the frequency of the calibration clock is 25 MHz, then M2=M1/3. The value of M2 is adjusted according to control signals 1312 supplied by interpolative divider 1305 to interpolative divider 1311 reflecting the phase difference detected by the PFD 1309.

Based on the calibration operation, the adjusted value of M2 can be stored in NVM. During normal operation, the frequency measuring loop can be turned off leaving the free running oscillator 1301 and the interpolative divider 1311 to operate in an open loop configuration. Thus, the embodiment illustrated in FIG. 13 can be used as a source-less clock synthesizer, e.g., a crystal-less clock source with a fixed free running oscillator that still provides a wide range of output frequencies. Note that temperature compensation may be required to adjust the divide ratio M2 to account for variations in the free running oscillator caused by temperature changes. Thus, in an embodiment a temperature compensation circuit 1320 senses the temperature with a temperature sensor. The temperature compensation circuit 1320 also includes an analog to digital converter (ADC) circuit to convert the sensed temperature to a digital value, which can then be summed with the stored value of M2 to adjust the interpolative divider according to the detected temperature. Details of the temperature compensation circuit are not shown as they are well known in the art.

The description of the invention set forth herein is illustrative, and is not intended to limit the scope of the invention as set forth in the following claims. For example. Variations and modifications of the embodiments disclosed herein, may be made based on the description set forth herein, without departing from the scope of the invention as set forth in the following claims.

What is claimed is:

1. An apparatus comprising:
   a fractional-N divider configured to receive a signal and supply a divided signal divided in accordance with a divide control signal;
   a delta sigma modulator coupled to receive a divide ratio and generate an integer portion and a digital quantization error and to supply the integer portion as the divide control signal to the fractional-N divider; and
   a phase interpolator coupled to the fractional-N divider and to the delta sigma modulator to adjust a phase of the divided signal according to the digital quantization error to reduce error in the divided signal.

2. The apparatus as recited in claim 1 further comprising a voltage controlled oscillator coupled to supply the fractional-N divider with the signal.

3. The apparatus as recited in claim 1 further comprising digital skew control logic to supply a digital skew control signal supplied to the delta sigma modulator to provide spread spectrum modulation of the divided signal.

4. The apparatus as recited in claim 2 further comprising a phase-locked loop including the VCO.

5. The apparatus as recited in claim 4 wherein the phase-locked loop includes a feedback divider, and the feedback divider includes a phase interpolator controlled by a digital quantization error of a second delta sigma modulator.

6. The apparatus as recited in claim 4 wherein the phase-locked loop comprises:
   a feedback divider, the feedback divider being an interpolative divider including,
      a second fractional-N divider coupled to receive a feedback signal and to supply a divided feedback signal divided in accordance with a second divide control value;
      a second delta sigma modulator coupled to receive another divide ratio and generate a second integer portion and a second digital quantization error and to supply the second integer portion as the second divide control signal to the second fractional-N divider; and
      a second phase interpolator coupled to the second fractional-N divider and to the second delta sigma modulator to adjust a phase of the divided feedback signal according to the second digital quantization error to reduce error in the divided feedback signal.

7. The apparatus as recited in claim 4 further comprising a fixed frequency source coupled to supply the phase-locked loop.

8. The apparatus as recited in claim 7 wherein the fixed frequency source is one of a crystal oscillator and a MEMS oscillator.

9. The apparatus as recited in claim 1 further comprising a non-volatile memory coupled to the delta sigma modulator to supply the divide ratio.

10. The apparatus as recited in claim 1 further comprising a free running oscillator supplying the signal to the fractional-N divider.

11. The apparatus as recited in claim 10 further comprising a temperature compensation circuit coupled to adjust the divide ratio according to the detected temperature.

12. A method comprising:
  receiving a divide ratio in a delta sigma modulator and generating an integer portion and a digital quantization error corresponding to the divide ratio and supplying the integer portion as a divide value to a fractional-N divider;
  dividing a signal in the fractional-N divider according to the divide value and generating a divided signal; and
  adjusting a phase of the divided signal in a phase interpolator coupled to the fractional-N divider according to the digital quantization error to reduce error in the divided signal.

13. The method as recited in claim 12 further comprising supplying the signal to the fractional-N divider from a voltage controlled oscillator.

14. The method as recited in claim 12 further comprising supplying a digital skew control signal to the delta sigma modulator to provide spread spectrum modulation.

15. The method as recited in claim 13 further comprising:
  supplying the signal from a phase-locked loop including a voltage controlled oscillator (VCO); and
  dividing a feedback signal from the VCO in a divider circuit of the phase-locked loop.

16. The method as recited in claim 15 further comprising:
  dividing the feedback signal in another fractional-N divider according to a feedback divide control signal corresponding to an integer portion of a feedback divide ratio; and
  adjusting a phase of the divided feedback signal in a phase interpolator according to a fractional portion of the feedback divide ratio corresponding to a digital quantization error of a second delta sigma modulator.

17. The method as recited in claim 15 further comprising supplying a phase and frequency detector of the phase-locked loop with a signal from a fixed frequency source coupled to the phase-locked loop.

18. The method as recited in claim 12 further comprising supplying the divide ratio from a non-volatile memory coupled to the delta sigma modulator.

19. A clock synthesis apparatus comprising:
  means for providing a divided signal corresponding to an integer portion of divide a divide ratio; and
  means for adjusting a phase of the divided signal according to a digital quantization error corresponding to a fractional portion of the divide ratio.

20. A method comprising reducing error in an output signal of a divider circuit by adjusting the output signal in a phase interpolator according to a quantization error generated in determining control values for the divider circuit.

21. The method as recited in claim 20 further comprising supplying the divider circuit with a signal to divide from a free running oscillator.

22. An apparatus comprising:
  a divider circuit coupled to receive a signal and supply a divided signal according to a sequence of divide values supplied by a divide control circuit; and
  a phase interpolation circuit coupled to the divide circuit to adjust the divided signal according to a quantization error generated by the divide control circuit in determining the divide values.

23. The apparatus as recited in claim 22 wherein the divide control circuit is a delta sigma modulator coupled to receive a divide ratio and generate an integer portion as the divide values and the quantization error.

* * * * *

UNITED STATES PATENT AND TRADEMARK OFFICE
CERTIFICATE OF CORRECTION

| | | |
|---|---|---|
| PATENT NO. | : 7,417,510 B2 | Page 1 of 1 |
| APPLICATION NO. | : 11/550223 | |
| DATED | : August 26, 2008 | |
| INVENTOR(S) | : Yunteng Huang | |

It is certified that error appears in the above-identified patent and that said Letters Patent is hereby corrected as shown below:

In claim 19, column 8, line 12, please remove the first occurrence of "divide".

Signed and Sealed this

Twenty-first Day of October, 2008

JON W. DUDAS
*Director of the United States Patent and Trademark Office*